United States Patent
Yang et al.

(10) Patent No.: US 10,440,824 B2
(45) Date of Patent: Oct. 8, 2019

(54) FLEXIBLE DISPLAY DEVICE AND ELECTRONIC APPARATUS

(71) Applicant: SHENZHEN ROYOLE TECHNOLOGIES CO. LTD., Shenzhen (CN)

(72) Inventors: Songling Yang, Shenzhen (CN); Zihong Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/540,646

(22) PCT Filed: Dec. 31, 2014

(86) PCT No.: PCT/CN2014/096036
§ 371 (c)(1),
(2) Date: Jun. 29, 2017

(87) PCT Pub. No.: WO2016/106735
PCT Pub. Date: Jul. 7, 2016

(65) Prior Publication Data
US 2018/0014406 A1    Jan. 11, 2018

(51) Int. Cl.
*H05K 1/18* (2006.01)
*H01L 51/52* (2006.01)
(Continued)

(52) U.S. Cl.
CPC .............. *H05K 1/18* (2013.01); *H01L 27/32* (2013.01); *H01L 27/3255* (2013.01);
(Continued)

(58) Field of Classification Search
CPC ...... H05K 1/18; H05K 1/028; H01L 27/3255; H01L 51/0097; H01L 2251/5338; G06F 3/041; G06F 2203/04102
(Continued)

(56) References Cited

U.S. PATENT DOCUMENTS

2003/0002003 A1* 1/2003 Kuwaharada ....... G02F 1/13452
349/149
2005/0237467 A1   10/2005 Takaishi
(Continued)

FOREIGN PATENT DOCUMENTS

| CN | 1389848 A | 1/2003 |
|---|---|---|
| CN | 1690780 A | 11/2005 |

(Continued)

OTHER PUBLICATIONS

Extended European search report dated Aug. 22, 2018 from corresponding application No. EP 14909542.4.

*Primary Examiner* — Michael P McFadden
(74) *Attorney, Agent, or Firm* — Hauptman Ham, LLP

(57) ABSTRACT

A flexible display device and an electronic device, applied to the technical field of display, are provided and aim at solving the technical problem in the related art that a driving IC is prone to rupture and/or breakage following bending of a flexible display panel. The flexible display device may include a flexible display panel, a flexible circuit board, and a driving IC. The flexible circuit board may include a body portion including an element arrangement region and a reserved region, and a connecting portion protruding from the reserved region and extending toward the flexible display panel, and is connected to the flexible display panel. A separation space is defined among the body portion, the connecting portion, and the flexible display panel. The driving IC is electrically installed in the element arrangement region.

20 Claims, 9 Drawing Sheets

(51) Int. Cl.
*H01L 27/32* (2006.01)
*H01L 51/00* (2006.01)
*H05K 1/02* (2006.01)
*G06F 3/041* (2006.01)

(52) U.S. Cl.
CPC .......... *H01L 51/0097* (2013.01); *H01L 51/52* (2013.01); *H05K 1/028* (2013.01); *G06F 3/041* (2013.01); *G06F 2203/04102* (2013.01); *H01L 2251/5338* (2013.01)

(58) Field of Classification Search
USPC ........................................................ 361/749
See application file for complete search history.

(56) References Cited

U.S. PATENT DOCUMENTS

| | | | |
|---|---|---|---|
| 2007/0008477 | A1 | 1/2007 | Huang |
| 2010/0073620 | A1 | 3/2010 | Yamaguchi et al. |
| 2012/0176564 | A1* | 7/2012 | Hatakeyama ......... G02F 1/1345 349/62 |
| 2014/0239277 | A1 | 8/2014 | Kim et al. |
| 2014/0268595 | A1* | 9/2014 | Eom ...................... H05K 1/028 361/749 |
| 2014/0355181 | A1* | 12/2014 | Jung ..................... G06F 1/1652 361/679.01 |

FOREIGN PATENT DOCUMENTS

| | | |
|---|---|---|
| CN | 1949309 A | 4/2007 |
| CN | 101097336 A | 1/2008 |
| CN | 101877993 A | 11/2010 |
| CN | 203573049 U | 4/2014 |
| CN | 103971604 A | 8/2014 |
| CN | 104009061 A | 8/2014 |
| CN | 104183196 A | 12/2014 |
| EP | 1085788 A2 | 3/2001 |
| JP | 2001-156418 A | 6/2001 |
| JP | 2005-331914 A | 12/2005 |
| JP | 2006-108361 A | 4/2006 |
| JP | 2006-173176 A | 6/2006 |
| JP | 4211390 B | 1/2009 |
| JP | 2010-72380 A | 4/2010 |
| WO | 2014171334 A1 | 10/2014 |

* cited by examiner

FLEXIBLE DISPLAY DEVICE AND ELECTRONIC APPARATUS

TECHNICAL FIELD

The present disclosure relates to the technical field of display, and particularly to a flexible display device, and an electronic device having the flexible display device.

BACKGROUND

Currently, common display devices include displays used by televisions, computers, cellphones and so on. Such displays may be liquid crystal displays ("LCD" for short) or light emitting diode ("LED" for short) displays, etc. These displays inevitably have certain weight, thickness, and volume, and they are fixed in a certain place. Based on this, applications of three-dimensional display or touch display bring new feelings and experiences to users. Flexible display devices are opposite to the above display devices. A core component of a flexible display device is a flexible display. The flexible display has enormous application potential due to its characteristics of being light and thin, bendable, etc.

Generally, the flexible display device is a display device which is made from a flexible material and is deformable and bendable, and which has characteristics of low power consumption, small volume, direct visualized flexibility and so on. Generally speaking, a driving IC is used to drive a flexible display and a flexible display product to display, and a common practice is: after bonding the driving IC on a TCP of a flexible thin film and a COP thin film, fixing them on a panel for use. FIG. 1 to FIG. 4 are structural schematic views of mounting a driving IC(s) 3a, FIG. 1 to FIG. 3 shows that one driving IC 3a is arranged at a side edge of a flexible display panel 1a, and FIG. 4 shows that the driving ICs 3a are arranged at two adjacent side edges of the flexible display panel 1a. It can be seen that the driving IC 3a is usually arranged along an edge of the flexible display panel 1a. Since the driving IC 3a has a certain geometrical length, according to the existing mounting methods, although the wiring of an IC circuit can be simplified, when the flexible display panel 1a provided with the driving IC 3a is bent, even if the driving IC 3a also can be bent therewith, if the bending curvature and the bending force become big, during the bending process, the driving IC 3a may be fractured and/or broken, thus damage is generated.

SUMMARY

The present disclosure aims to provide a flexible display device and an electronic device, which, by defining a reserved region in a flexible circuit board, aim at solving the technical problem in the related art that a driving IC is prone to rupture and/or breakage following bending of a flexible display panel.

According to a first aspect, a flexible display device is provided. The flexible display device may include a flexible display panel, a flexible circuit board, and a driving IC. The flexible display panel is bendable and deformable. The flexible circuit board is electrically coupled to the flexible display panel, and may include a body portion, and a connecting portion. The body portion may include an element arrangement region, and a reserved region. The connecting portion protrudes from the reserved region and extends toward the flexible display panel, and is connected to the flexible display panel. A separation space is defined among the body portion, the connecting portion, and the flexible display panel. The driving IC is electrically installed in the element arrangement region.

In combination with the first aspect, in a first possible implementation, the connecting portion is connected to a connecting side edge of the flexible display panel.

In combination with the first possible implementation of the first aspect, in a second possible implementation, the body portion is divided into the element arrangement region and the reserved region the connecting side edge.

In combination with the first possible implementation of the first aspect, in a third possible implementation, an arrangement direction of the driving IC is parallel to the connecting side edge.

In combination with the first possible implementation of the first aspect, in a fourth possible implementation, the reserved region is an expanding region corresponding to a side of the connecting portion that faces away from the connecting side edge.

In combination with the fourth possible implementation of the first aspect, in a fifth possible implementation, the reserved region may include the expanding region, and a separation region located between the expanding region and the element arrangement region.

In combination with the fourth possible implementation of the first aspect, in a sixth possible implementation, the element arrangement region may include a first element arrangement region and a second element arrangement region located at two sides of the expanding region.

In combination with the fifth possible implementation of the first aspect, in a seventh possible implementation, the reserved region may include the expanding region, and a first separation region and a second separation region located at two sides of the expanding region.

In combination with the first aspect, in an eighth possible implementation, the body portion may further include an extension region protruding and extending from the element arrangement region and facing away from the flexible display panel. The driving IC is arranged in the extension region.

In combination with the first aspect or any one of the first to seventh possible implementations of the first aspect, in a ninth possible implementation, the flexible display device may include a plurality of the flexible circuit boards.

In a second aspect, an electronic device is provided which may include any one of the above flexible display devices.

Technical effects of the present disclosure with respect to the related art are: by defining the reserved region in the flexible circuit board and arranging the driving IC in the element arrangement region, the bending deformation of the flexible display panel does not affect the driving IC arranged on the flexible circuit board, thereby avoiding the phenomenon of causing damage such as fracture or breakage to the driving IC.

BRIEF DESCRIPTION OF THE DRAWINGS

In order to illustrate the technical solutions of embodiments of the present disclosure more clearly, the accompanying drawings used in the description of the embodiments or the related art will be briefly described. Apparently, the accompanying drawings described in the following are some embodiments of the present disclosure, and a person skilled in the art can obtain other accompanying drawings without any creative effort.

DETAILED DESCRIPTION

In order to make clearer the object, technical solutions, and advantages of the present disclosure, below the present disclosure is further described in detail in combination with the accompanying drawings and embodiments. It shall be understood that the specific embodiments described herein are merely used to illustrate the present disclosure but not to limit the present disclosure.

Figure 1:
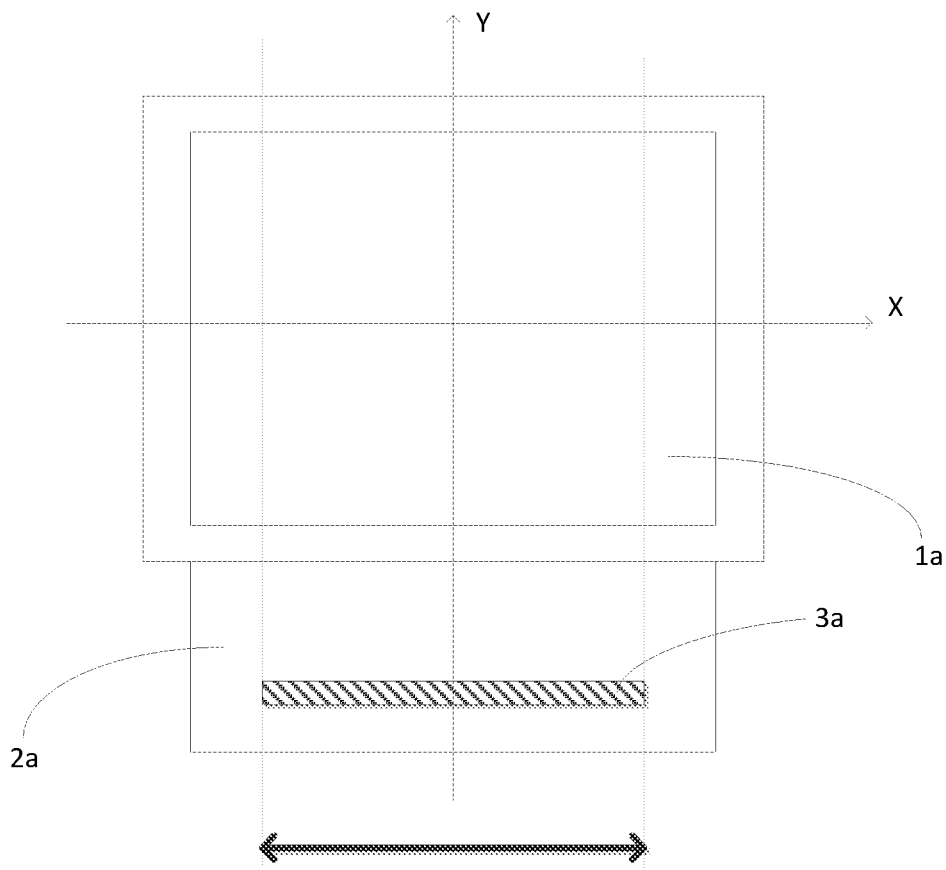
FIG. 1 is a structural schematic view of a flexible display panel according to the related art, showing a driving IC mounted on the flexible display panel.
Figure 2:
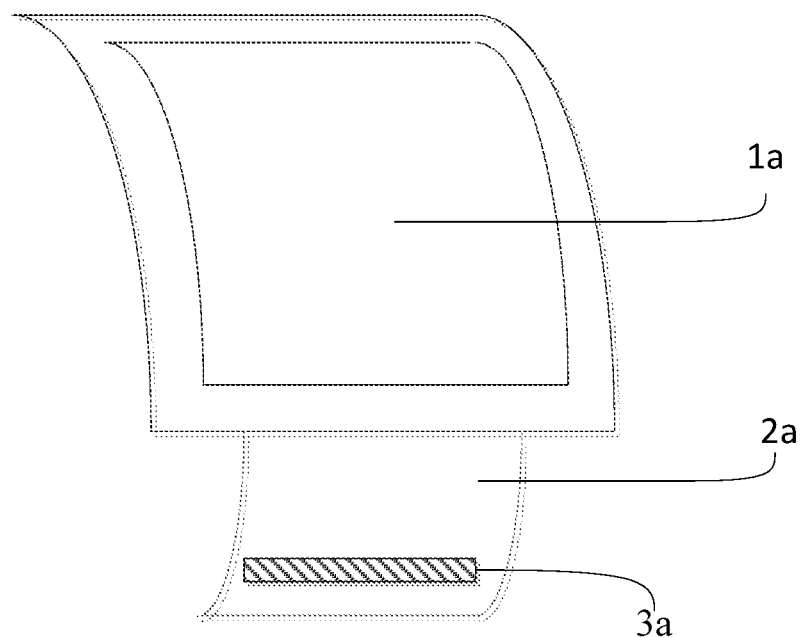
FIG. 2 is a structural schematic view showing the flexible display panel of FIG. 1 bent along a long side of the flexible display panel.
Figure 3:
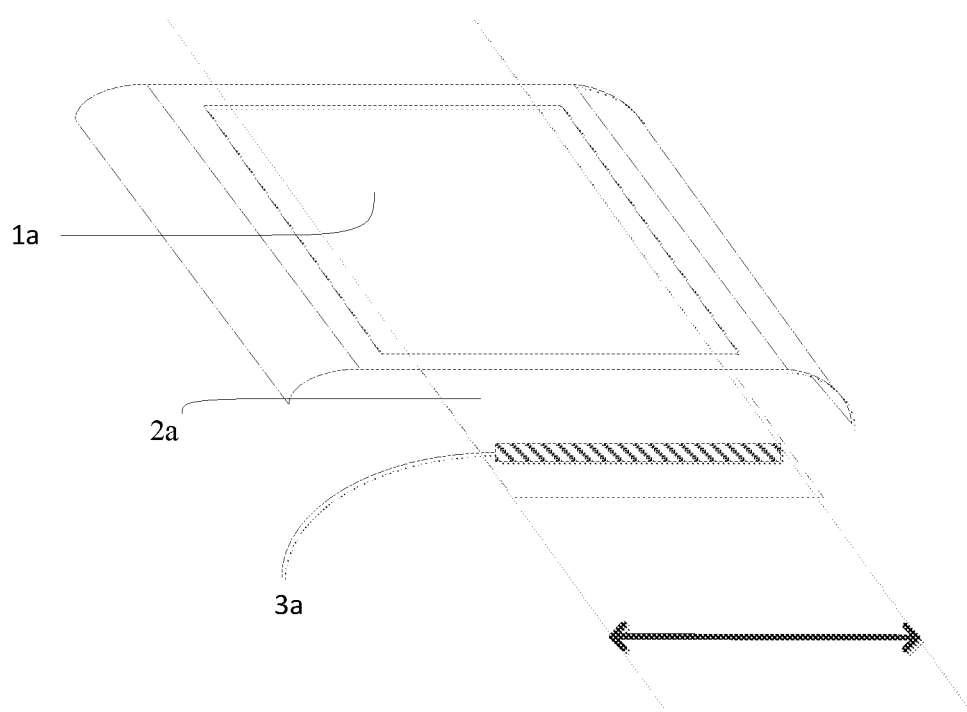
FIG. 3 is a structural schematic view showing the flexible display panel of FIG. 1 bent along a short side of the flexible display panel.
Figure 4:
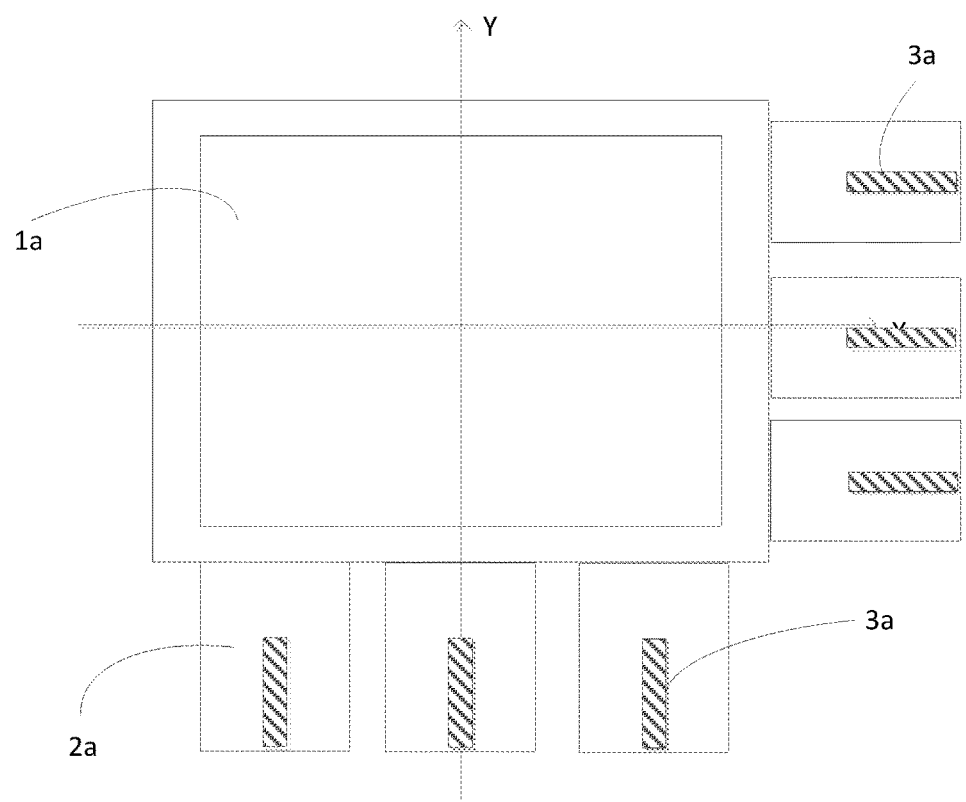
FIG. 4 is another structural schematic view of a flexible display panel according to the related art, showing driving ICs mounted on the flexible display panel.
Figure 5:
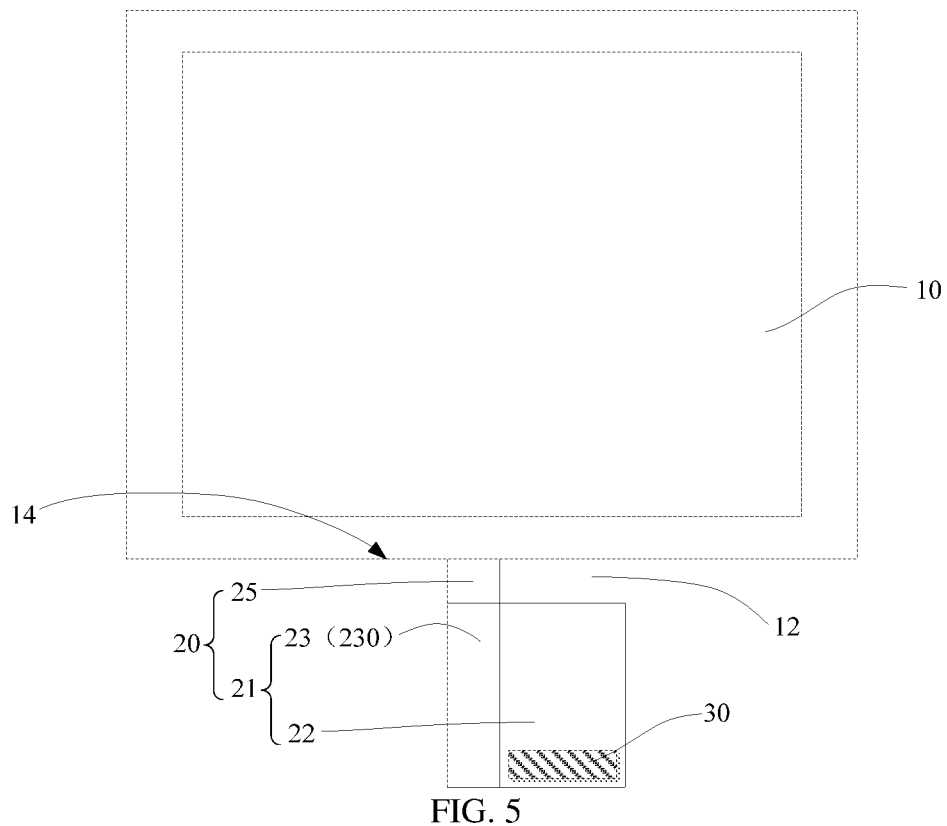
FIG. 5 is a structural schematic view of a flexible display device according to an embodiment of the present disclosure.
Figure 6:
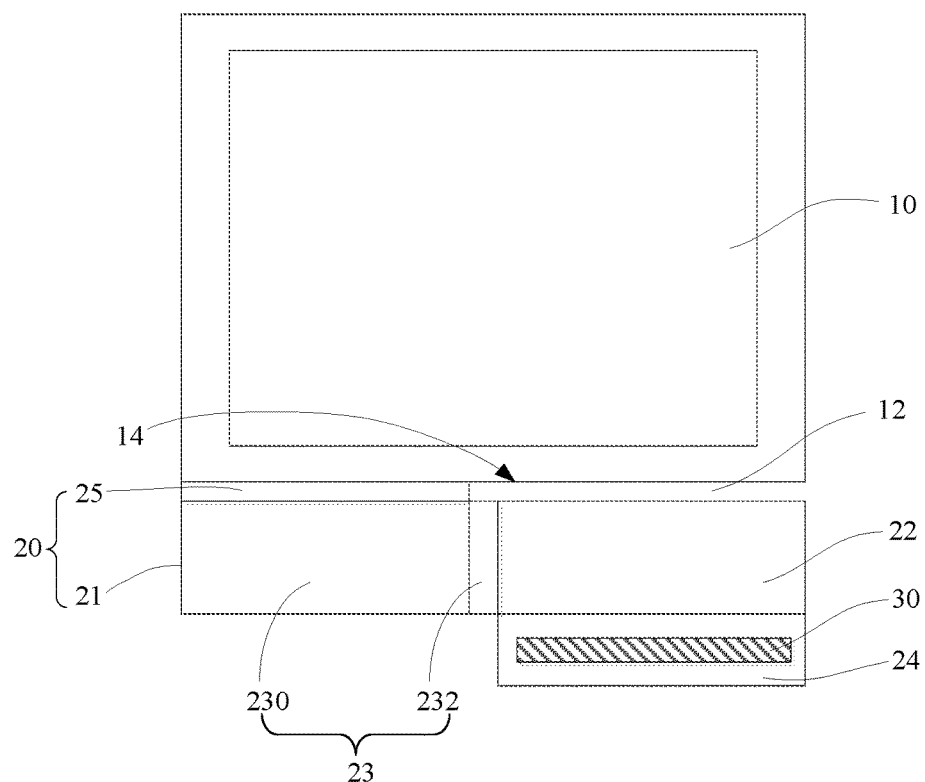
FIG. 6 is another structural schematic view of a flexible display device according to an embodiment of the present disclosure.
Figure 7:
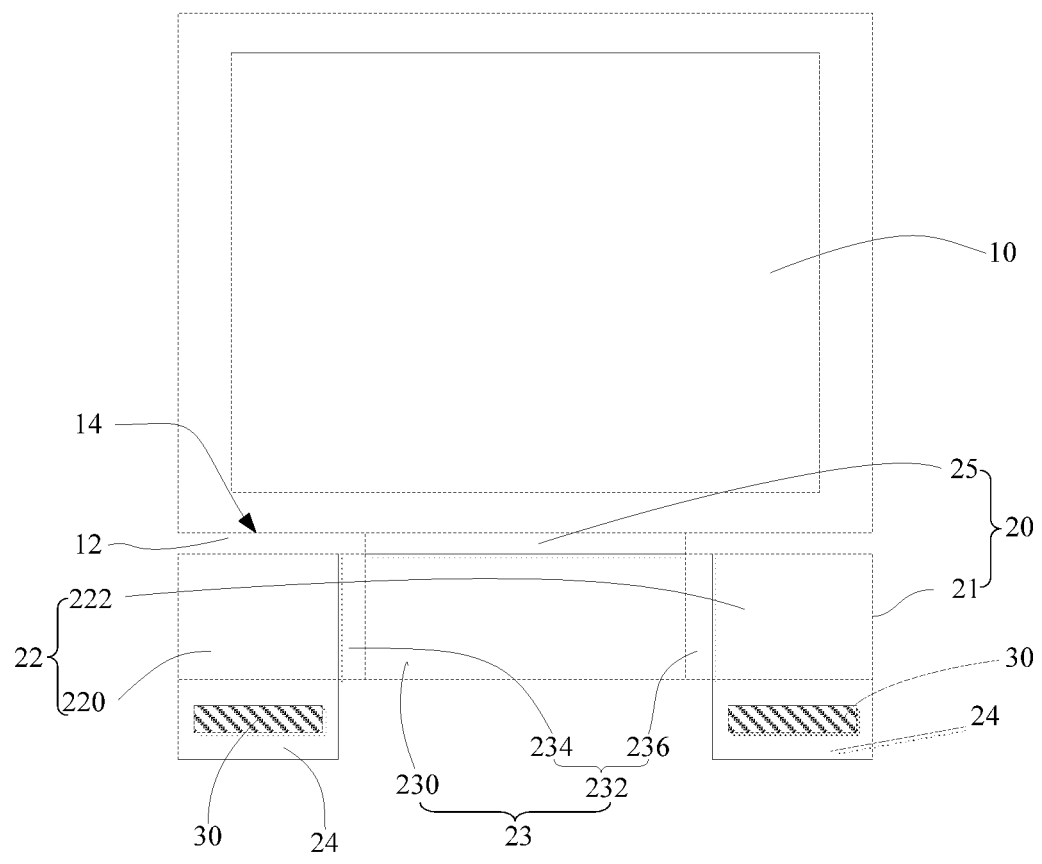
FIG. 7 is a further structural schematic view of a flexible display device according to an embodiment of the present disclosure.

Referring to FIG. 5 to FIG. 7, a flexible display device provided in an embodiment of the present disclosure may include a flexible display panel 10, a flexible circuit board 20, and a driving IC 30. The flexible display panel 10 is bendable and deformable. The flexible circuit board 20 is electrically coupled to the flexible display panel 10, and may include a body portion 21, and a connecting portion 25. The body portion 21 may include an element arrangement region 22, and a reserved region 23. The connecting portion 25 protrudes from the reserved region 23 and extends toward the flexible display panel 10, and is connected to the flexible display panel 10. A separation space 12 is defined among the body portion 21, the connecting portion 25, and the flexible display panel 10. The driving IC 30 is electrically installed in the element arrangement region 22.

For the flexible display device provided in the embodiment of the present disclosure, by defining the reserved region 23 in the flexible circuit board 20 and defining the separation space 12 between the body portion 21 and the flexible display panel 10, and by arranging the driving IC 30 in the element arrangement region 22, the bending and deformation of the flexible display panel 10 does not affect the driving IC 30 arranged in the flexible circuit board 20, thereby avoiding the phenomenon of causing damage such as fracture or breakage to the driving IC 30.

In the embodiment, since the separation space 12 is defined between the body portion 21 and the flexible display panel 10, and the reserved region 23 is defined in the flexible circuit board 20, when the flexible display panel 10 is bent along its any side edge, the element arrangement region 22, together with the driving IC 30, are not bent and deformed, thus, the driving IC 30 does not affect the bending and deformation of the flexible display panel 10.

In the embodiment, the reserved region 23, the element arrangement region 22, and the connecting portion 25 are integrally formed from a monolithic piece.

In the embodiment, the flexible display panel 10 is an OLED flexible display, or a flexible touch display.

In the embodiment, the flexible display panel 10, together with the flexible circuit board 20, can be bent and deformed along a long side or a short side of the flexible display panel 10.

Referring to FIG. 5 to FIG. 7, furthermore, the connecting portion 25 is connected to a connecting side edge 14 of the flexible display panel 10. The connecting portion 25 is not limited to physically connect with the connecting side edge 14, but also electrically connect with the flexible display panel 10 through the connecting side edge 14. It can be understood that the connecting portion 25 extends from the reserved region 23, and is connected to the connecting side edge 14 of the flexible display panel 10. A plane where the connecting portion 25 is located is parallel to a display surface of the flexible display panel 10.

Referring to FIG. 5, preferably, the body portion 21 is divided into the element arrangement region 22 and the reserved region 23 along the connecting side edge 14. It can be understood that along the connecting side edge 14, the element arrangement region 22 and the reserved region 23 are arranged side by side. The arrangement direction of the element arrangement region 22 and the reserved region 23 is an extending direction of the connecting side edge 14, or an angle is defined between the arrangement direction of the element arrangement region 22 and the reserved region 23 and the extending direction of the connecting side edge 14, and the angle falls within a range of 0-180 degrees except 90 degrees.

Preferably, the arrangement direction of the driving IC 30 is parallel to the connecting side edge 14. In other embodiments, the arrangement direction of the driving IC 30 is perpendicular to the connecting side edge 14, or any angle is defined between the arrangement direction of the driving IC 30 and the connecting side edge 14.

Referring to FIG. 5, preferably, the reserved region 23 is an expanding region 230 facing a side of the connecting portion 25 that faces away from the connecting side edge 14. It can be understood that when the flexible circuit board 20 is in an unfolded state, the connecting portion 25, the reserved region 23, and the element arrangement region 22 form an L shape. The connecting portion 25 is located between the reserved region 23 and the flexible display panel 10, and the arrangement direction of the connecting portion 25 and the reserved region 23 is perpendicular to the connecting side edge 14 of the flexible display panel 10. The connecting side edge 14 is a side edge connected to the connecting portion 25. When the flexible display panel 10 is bent and deformed along the connecting side edge 14, since the element arrangement region 22 is not bent and deformed due to the separation space 12, damage to the driving IC 30 is avoided. Likewise, when the flexible display panel 10 is bent and deformed along a side edge adjacent to the connecting side edge 14, the connecting portion 25 and the reserved region 23 are bent and deformed, but the element arrangement region 22 is not bent and deformed due to the separation space 12, damage to the driving IC 30 is avoided.

Figure 8:
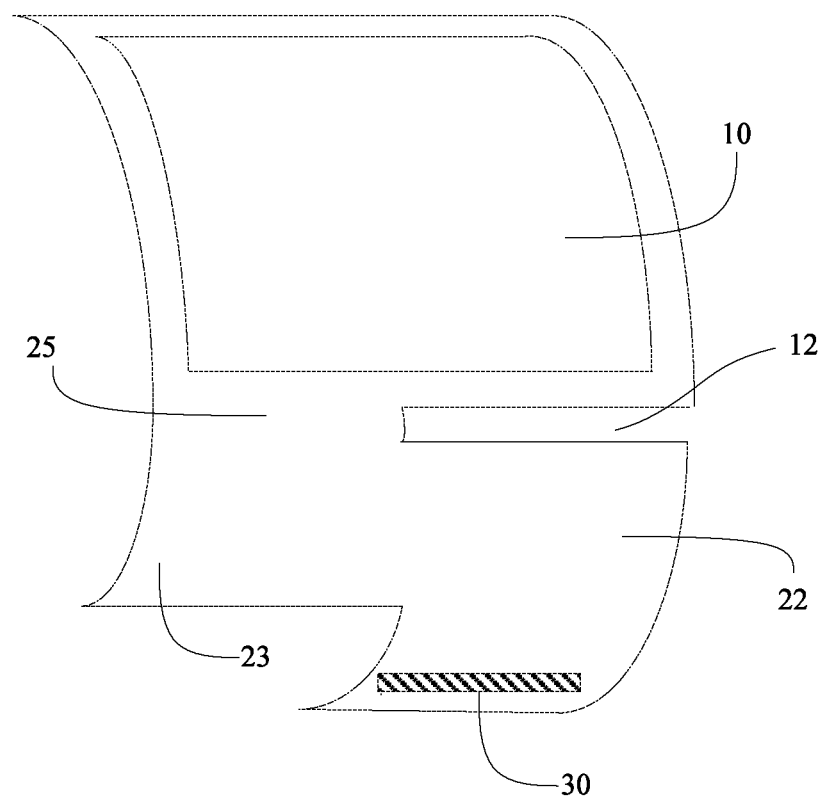
FIG. 8 is a structural schematic view showing the flexible display device of FIG. 5 bent along a connecting side edge of a flexible display panel.
Figure 9:
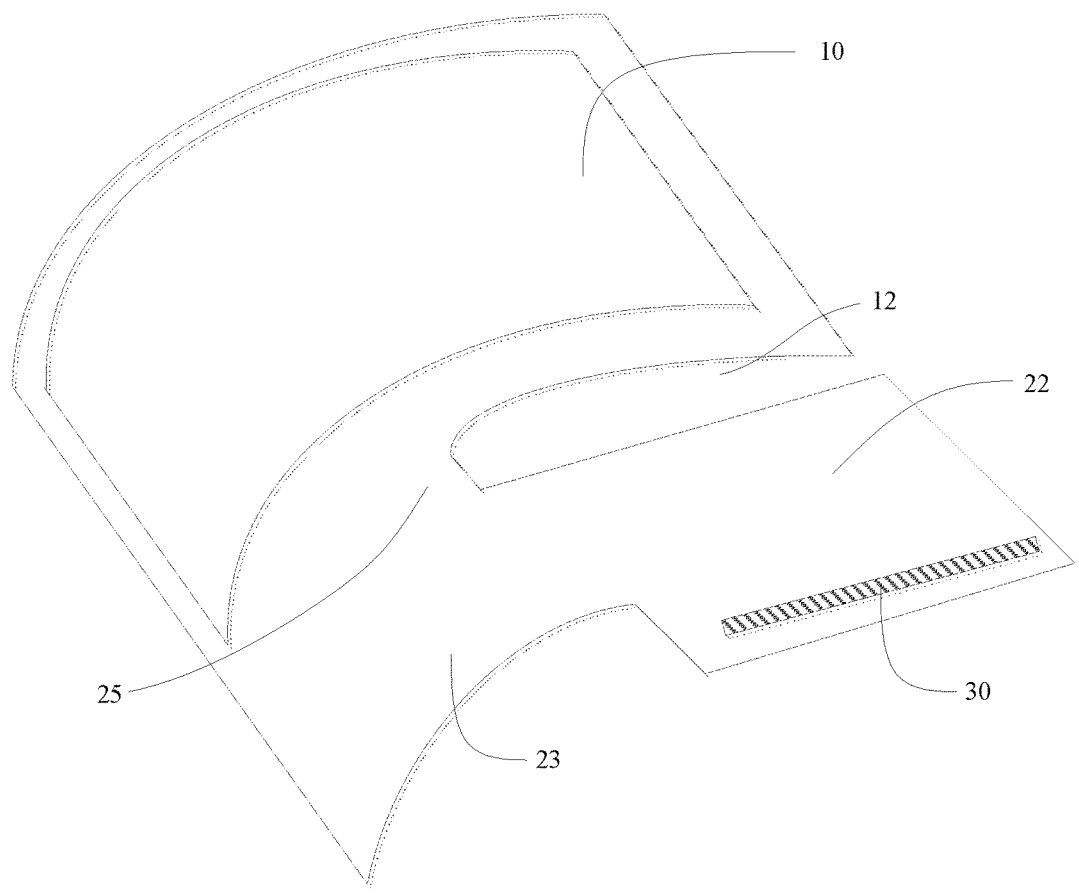
FIG. 9 is a structural schematic view showing the flexible display device of FIG. 5 bent around another connecting side edge of the flexible display panel.

Referring to FIG. 6, preferably, the reserved region 23 includes the expanding region 230, and a separation region 232 located between the penetrating region 230 and the element arrangement region 22. The reserved region 23 includes the expanding region 230 located at the side of the connecting portion 25 facing away from the connecting side edge 14, and the separation region 232 located between the expanding region 230 and the element arrangement region 22. It can be understood that the expanding region 230, the separation region 232, and the element arrangement region 22 are arranged side by side along the extending direction of the connecting side edge 14, and the separation region 232, the expanding region 230, and the connecting portion 25 form an L shape. When the flexible display panel 10 is bent and deformed along the connecting side edge 14, since the element arrangement region 22 is not bent and deformed due to the separation space 12, damage to the driving IC 30 is avoided, as shown in FIG. 8. Likewise, when the flexible display panel 10 is bent and deformed along the side edge adjacent to the connecting side edge 14, the connecting portion 25 and the reserved region 23 are bent and deformed, but since the reserved region 23 and the element arrangement region 22 are arranged side by side and form a surrounding side of the separation space 12, the element arrangement region 22 is not bent and deformed, thereby avoiding damage to the driving IC 30, as shown in FIG. 9.

Referring to FIG. 7, preferably, the reserved region 23 includes the expanding region 230 located at the side of the connecting portion 25 facing away from the connecting side edge 14, and a first separation region 234 and a second separation region 236 located at two sides of the expanding region 230. It can be understood that the first separation region 234 and the second separation region 236 are located at two sides of the expanding region 230, thus, the first separation region 234, the expanding region 230, the second separation region 236, and the connecting portion 25 form a T-shape structure. The arrangement direction of the connecting portion 25 and the expanding region 230, and the arrangement direction of the first separation region 234, the expanding region 230, and the second separation region 236, are perpendicular to each other, or form a certain angle therebetween. When the flexible display panel 10 is bent and deformed along the connecting side edge 14, since the element arrangement region 22 is not bent and deformed due to the separation space 12, damage to the driving IC 30 is avoided. Likewise, when the flexible display panel 10 is bent and deformed along the side edge adjacent to the connecting side edge 14, since the element arrangement region 22 is not bent and deformed due to the separation space 12, the first separation region 234, and the second separation region 236, damage to the driving IC 30 is avoided.

Referring to FIG. 7, preferably, the element arrangement region 22 includes a first element arrangement region 220 and a second element arrangement region 222 located at two sides of the expanding region 230. It can be understood that the first element arrangement region 220 and the second element arrangement region 222 are located at two sides of the expanding region 230, that is, the arrangement direction of the first element arrangement region 220, the expanding region 230, and the second element arrangement region 222 is parallel to the extending direction of the connecting side edge 14, alternatively, the arrangement direction of the first element arrangement region 220, the first separation region 234, the expanding region 230, the second separation region 236, and the second arrangement region 222 is parallel to the extending direction of the connecting side edge 14.

Referring to FIG. 5 to FIG. 7, more preferably, the body portion 21 may further include an extension region 24 protruding and extending from the element arrangement region 22 and facing away from the flexible display panel 10. The driving IC 30 is arranged in the extension region 24. It can be understood that the extension region 24 and the separation space 12 are located at two sides of the element arrangement region 22, and the arrangement direction of the extension region 24 and the element arrangement region 22 is perpendicular to the connecting side edge 14 of the flexible display panel 10, or a certain angle is defined between the arrangement direction of the extension region 24 and the element arrangement region 22, and the connecting side edge 14 of the flexible display panel 10.

Furthermore, the flexible display device may include multiple flexible circuit boards 20. Preferably, the flexible circuit boards 20 are connected to a side or sides of the flexible display panel 10. The flexible circuit boards 20 are arranged side by side along the connecting side edge 14 of the flexible display panel 10.

As shown in FIG. 5 to FIG. 7, an electronic device provided in an embodiment of the present disclosure includes the flexible display device. The flexible display device may include the flexible display panel 10, the flexible circuit board 20, and the driving IC 30. The flexible display panel 10 is bendable and deformable. The flexible circuit board 20 is electrically coupled to the flexible display panel 10, and may include the body portion 21, and the connecting portion 25. The body portion 21 may include the element arrangement region 22, and the reserved region 23. The connecting portion 25 protrudes from the reserved region 23 and extends toward the flexible display panel 10, and is connected to the flexible display panel 10. The separation space 12 is defined among the body portion 21, the connecting portion 25, and the flexible display panel 10. The driving IC 30 is electrically installed in the element arrangement region 22.

The flexible display device of the electronic device provided in the embodiment of the present disclosure may be the flexible display device of any one of the above embodiments, having the same structure and function, and unnecessary details will not be given herein.

The above-mentioned descriptions are merely for preferable embodiments of the present disclosure and not used to limit the present disclosure. Any modifications, equivalent substitutions, improvements and so on, made within the spirit and principle of the present disclosure, shall be covered by the scope of protection of the present disclosure.

What is claimed is:
1. A flexible display device, comprising:
    a flexible display panel, the flexible display panel being bendable and deformable;
    a flexible circuit board electrically coupled to the flexible display panel, and comprising a body portion and a connecting portion, wherein, the body portion comprises a reserved region and an element arrangement region within the body portion; the connecting portion protrudes from the reserved region and extends toward the flexible display panel, and is connected to the flexible display panel; and
    a driving IC electrically installed in the element arrangement region;
    wherein, when the flexible circuit board is unfolded, a first side of the reserved region connected to the connecting portion and a second side of the element arrangement region facing the flexible display panel are collinear, a separation space is defined among the body portion, the connecting portion and the flexible display panel, the separation space has an end terminated at a third side of the connecting portion, and the third side of the connecting portion extends along a line avoiding the driving IC.
2. The flexible display device of claim 1, wherein the connecting portion is connected to a connecting side edge of the flexible display panel, and the connecting side edge of the flexible display panel is a peripheral side of the flexible display panel.

3. The flexible display device of claim 2, wherein the body portion is divided into the element arrangement region and the reserved region along the connecting side edge.

4. The flexible display device of claim 2, wherein the reserved region is an expanding region corresponding to a side of the connecting portion that faces away from the connecting side edge.

5. The flexible display device of claim 4, wherein the reserved region comprises the expanding region, and a separation region located between the expanding region and the element arrangement region.

6. The flexible display device of claim 4, wherein the element arrangement region comprises a first element arrangement region, and a second element arrangement region located at two sides of the expanding region.

7. The flexible display device of claim 6, wherein the reserved region comprises the expanding region, and a first separation region and a second separation region located at the two sides of the expanding region.

8. The flexible display device of claim 1, wherein the connecting portion and the reserved portion are in line with each other along the first direction, and the reserved region and the element arrangement region are in line with each other along the second direction.

9. The flexible display device of claim 1, wherein the first direction is a longitudinal direction, and the second direction is a latitudinal direction.

10. The flexible display device of claim 1, wherein when the flexible circuit board is in an unfolded state, the connecting portion, the reserved portion, and the element arrangement region form an L shape.

11. An electronic device, comprising:
a flexible display device comprising:
a flexible display panel, the flexible display panel being bendable and deformable;
a flexible circuit board electrically coupled to the flexible display panel, and comprising a body portion and a connecting portion, wherein, the body portion comprises a reserved region and an element arrangement region within the body portion; the connecting portion protrudes from the reserved region and extends toward the flexible display panel, and is connected to the flexible display panel; a separation space is defined among the body portion, the connecting portion, and the flexible display panel; and
a driving IC electrically installed in the element arrangement region;
wherein, when the flexible circuit board is unfolded, a first side of the reserved region connected to the connecting portion and a second side of the element arrangement region facing the flexible display panel are collinear, a separation space is defined among the body portion, the connecting portion and the flexible display panel, and the separation space has an end terminated at a third side of the connecting portion, and the third side of the connecting portion extends along a line avoiding the driving IC.

12. The electronic device of claim 11, wherein the connecting portion is connected to a connecting side edge of the flexible display panel, and the connecting side edge of the flexible display panel is a peripheral side of the flexible display panel.

13. The electronic device of claim 12, wherein the reserved region is an expanding region corresponding to a side of the connecting portion that faces away from the connecting side edge.

14. The electronic device of claim 13, wherein the reserved region comprises the expanding region, and a separation region located between the expanding region and the element arrangement region.

15. The electronic device of claim 13, wherein the element arrangement region comprises a first element arrangement region, and a second element arrangement region located at two sides of the expanding region.

16. The electronic device of claim 15, wherein the reserved region comprises the expanding region, and a first separation region and a second separation region located at the two sides of the expanding region.

17. The electronic device of claim 11, wherein the connecting portion and the reserved portion are in line with each other along the first direction, and the reserved region and the element arrangement region are in line with each other along the second direction.

18. The electronic device of claim 11, wherein the first direction is a longitudinal direction, and the second direction is a latitudinal direction.

19. The electronic device of claim 11, wherein when the flexible circuit board is in an unfolded state, the connecting portion, the reserved portion, and the element arrangement region form an L shape.

20. A flexible display device, comprising:
a flexible display panel, the flexible display panel being bendable and deformable;
a flexible circuit board electrically coupled to the flexible display panel, and comprising a body portion and a connecting portion, wherein, the body portion comprises an element arrangement region, a reserved region, and an extension region protruding and extending from the element arrangement region and facing away from the flexible display panel, the extension region is defined within the body portion; the connecting portion protrudes from the reserved region and extends toward the flexible display panel, and is connected to the flexible display panel; and
a driving IC electrically installed in the extension region;
wherein, when the flexible circuit board is unfolded, a first side of the reserved region connected to the connecting portion and a second side of the element arrangement region facing the flexible display panel are collinear, a separation space is defined among the body portion, the connecting portion and the flexible display panel, the separation space has an end terminated at a third side of the connecting portion, and the third side of the connecting portion extends along a line avoiding the driving IC.

* * * * *